US005952778A

United States Patent [19]

Haskal et al.

[11] Patent Number: 5,952,778

[45] Date of Patent: Sep. 14, 1999

[54] ENCAPSULATED ORGANIC LIGHT EMITTING DEVICE

[75] Inventors: Eliav Haskal, Zurich, Switzerland; Siegfried Karg, Solnhofen, Germany; Jesse Richard Salem, Cupertino; John Campbell Scott, Los Gatos, both of Calif.

[73] Assignee: International Business Machines Corporation, Armonk, N.Y.

[21] Appl. No.: 08/820,219

[22] Filed: Mar. 18, 1997

[51] Int. Cl.[6] ................................ H01J 1/62; H01J 63/04

[52] U.S. Cl. .......................... 313/504; 313/506; 313/507; 313/512

[58] Field of Search .................................... 313/503–504, 313/505, 506–507, 509–510, 512

[56] References Cited

U.S. PATENT DOCUMENTS

| | | | |
|---|---|---|---|
| 4,356,429 | 10/1982 | Tang | 313/503 |
| 4,539,507 | 9/1985 | VanSlyke et al. | 313/504 |
| 4,983,310 | 1/1991 | Benjamin et al. | 252/32.7 |
| 5,124,204 | 6/1992 | Yamashita et al. | 313/506 X |
| 5,169,547 | 12/1992 | Farng et al. | 252/49.6 |
| 5,189,549 | 2/1993 | Leventis et al. | 359/271 |
| 5,214,306 | 5/1993 | Hashimoto | 257/632 |
| 5,247,190 | 9/1993 | Friend et al. | 257/40 |
| 5,296,724 | 3/1994 | Ogata et al. | 257/98 |
| 5,328,580 | 7/1994 | Reamey | 204/181.1 |
| 5,337,374 | 8/1994 | Konishikawa | 384/107 |
| 5,362,410 | 11/1994 | Okorodudu et al. | 282/47.5 |
| 5,373,175 | 12/1994 | Ozawa et al. | 257/99 |
| 5,391,756 | 2/1995 | Karol et al. | 598/112 |
| 5,408,109 | 4/1995 | Hegger et al. | 257/40 |
| 5,449,926 | 9/1995 | Holm et al. | 257/88 |
| 5,593,788 | 1/1997 | Shi et al. | 428/690 |
| 5,757,126 | 5/1998 | Harvey, III et al. | 313/506 |
| 5,771,562 | 6/1998 | Harvey, III et al. | 313/512 X |
| 5,811,177 | 9/1998 | Shi et al. | 313/506 X |

OTHER PUBLICATIONS

J. Kido, "Recent Advances in Organic Electroluminescent Devices", Department of Materials Science and Engineering, Yamagata University, Yonezawa, Yamagata 992, Japan, 1994 Cecri, pp. 1–13.

Qibing Pei et al., "Polymer Light Emitting Electrochemical Cells" Science, vol. 269, Aug. 1995, pp. 1086–1088.

*Primary Examiner*—Sandra O'Shea
*Assistant Examiner*—Mack Haynes
*Attorney, Agent, or Firm*—Robert B. Martin; Thomas R. Berthold

[57] ABSTRACT

The invention relates to an encapsulated organic light emitting device having an improved protective covering comprising a first layer of passivating metal, a second layer of an inorganic dielectric material and a third layer of polymer.

6 Claims, 2 Drawing Sheets

ENCAPSULATED ORGANIC LIGHT EMITTING DEVICE

FIELD OF THE INVENTION

The present invention relates to an encapsulated organic light emitting device having an improved protective covering.

BACKGROUND OF THE INVENTION

Inorganic electroluminescent devices such as LED's are known in the art. The device generally comprises a chip of phosphor disposed between two electrodes. The phospher generally comprised a rectifying semiconductor such as gallium arsenide doped with aluminum or phosphorous. Upon application of a current, the gallium arsenide emits light. However, due to the complexity of manufacture, these devices can not be easily fabricated in large area displays or arrays.

Organic electroluminescent devices (materials and structure) are also known in the art as disclosed in Tang, U.S. Pat. No. 4,356,429 Shi et al., U.S. Pat. No. 5,593,788 and Heeger, U.S. Pat. No. 5,408,109, the disclosures of which are incorporated herein by reference for all purposes.

Organic electroluminescent devices (OLED) generally comprise an organic electroluminescent material sandwiched between two electrodes. Generally, the organic electroluminescent material is a multilayer structure comprising an electron transport layer, an electroluminescent layer and a hole transport layer. Upon application of an electrical current, the material radiates light generated by recombination of electrons and holes in the organic material. However, the organic luminescent materials are sensitive to contamination, oxidation and humidity. Further, in some OLED, the electrodes are also sensitive to contamination, oxidation and humidity. For example, Heeger teaches fabricating the OLED cathode electrode from a low work function metal such as calcium. However, Tang teaches that a cathode electrode made from reactive materials such as calcium are susceptible to oxidation. Tang teaches utilizing more stable materials with higher work function for the cathode electrode. The lack of an effective encapsulant to protect the OLED from the environment remains a major obstacle to OLED development.

Therefore, there is still a need in the art for an encapsulated organic electroluminescent device which is stable in an ambient environment.

It is therefore an object of the present invention to provide an improved encapsulated electroluminescent device.

Other objects and advantages will become apparent from the following disclosure,

SUMMARY OF THE INVENTION

The present invention relates to an encapsulated organic light emitting device comprising an organic light emitting material sandwiched between a first (anode) electrode and a second (cathode) electrode. The outer surface of the first electrode is suitably contiguous to a substrate preferably transparent e.g., glass. The outer surface of the second electrode is contiguous to a protective covering. The second electrode comprises an alkali metal, alkaline earth metal, rare earth metal or alloys thereof. The protective covering shields the device from ambient contaminants, oxygen and water to prevent its oxidation and degradation. The protective covering comprises three contiguous layers as follows: a first layer of thin film deposited passivation metal, a second layer of thin film deposited dielectric material such as silicon dioxide or silicon nitride and a third layer of a hydrophobic polymer. The protective covering protects the organic electroluminescent material and the reactive electrode from oxidative and hydrolytic degradation in an ambient environment, thereby substantially improving the lifetime of the device.

A more thorough disclosure of the present invention is presented in the detailed description which follows and from the drawing.

DETAILED DESCRIPTION OF THE INVENTION

The present invention generally relates to an encapsulated light emitting device comprising an organic light emitting composition disposed between a first and second electrode.

Figure 1:
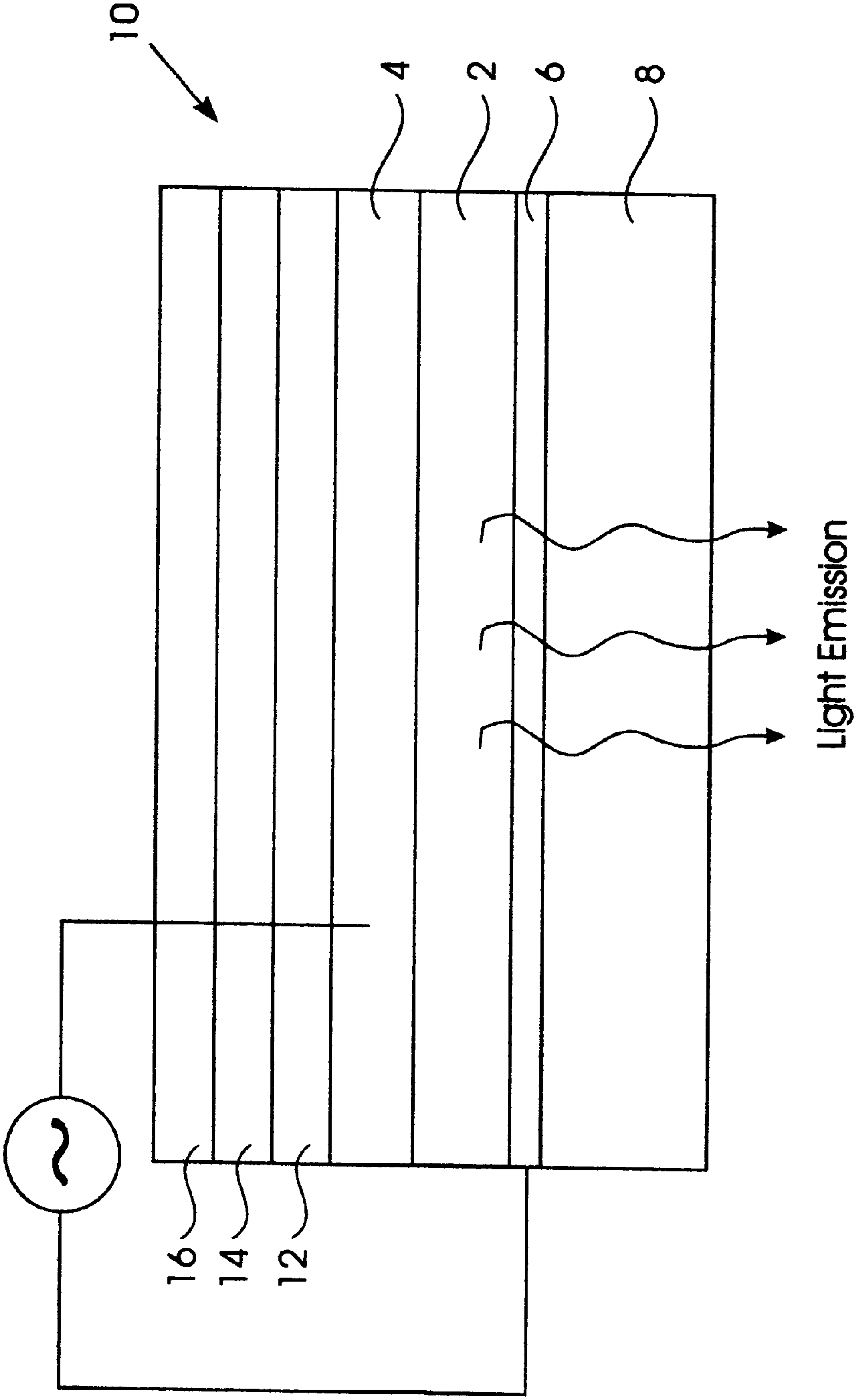
FIG. 1 is a cross-sectional view of an embodiment of the light emitting device of the present invention.

Referring to FIG. 1, there is shown an embodiment of the device comprising the light emitting composition 2 sandwiched between and contiguous with cathode electrode 4 and transparent anode electrode 6. The anode electrode is supported on a glass base 8. A three-layer protective covering 10 is contiguous to cathode electrode 4. When a voltage is applied to electrodes 4 and 6 light is emitted from composition 2 and radiates from the device through transparent electrode 6 and glass base 8.

A variety of organic light emitting compositions can be utilized in the present invention such as those disclosed in the above patents. The composition can be monomeric or polymeric. Suitable light emitting monomeric compositions include aromatic compounds such as anthracene, naphthalene, phenanthrene, pyrene, chrysene and perylene; butadienes such as 1,4-diphenylbutadiene and tetraphenylbutadiene; coumarins; acridine; stilbenes such as transtilbene; and metallo-quinoline such as tris-hydroxy quinolinate aluminum and other metal chelates and host-dopant combinations such as described in Appl. Phys. Letter 67, 3853 and Appl. Phys. Letter 69,3309, the disclosures of which are incorporated herein by reference for all purposes. These monomeric light-emitting materials may be deposited by standard thin-film preparation techniques including vacuum evaporation or sublimination. These light emitting monomers can also be dispersed in a polymeric binder. Suitable binders include poly(vinyl carbazole), poly (vinyltoluene), poly(methyl methacrylate), poly(acrylonitrile) and poly (vinyl acetate); and condensation polymers such as polyesters, polycarbonates polyimides and polysulfones. Optionally, the polymer can itself exhibit light emitting properties (e.g., side chain bonding of light emitting substituent).

The light emitting composition can also be polymeric. Suitable polymers for use in the composition of the present invention are poly(phenylene vinylene) e.g., poly(1,4 phenylene vinylene); poly-(2,5-dialkoxy-1,4 phenylene vinylene); poly(2,5-dialkyl-1,4 phenylene vinylene); poly (phenylene) poly(2,5-dialkyl-1,4 phenylene); poly((p-phenylene); poly(thiophene) e.g., poly(3-alkylthiophene); poly(fluorene) e.g., poly(9,9-dialkyl fluorene) and copolymers of the above functionalities where the alkyl and alkoxy substituents are $C_{1-20}$. The polymers can also be substituted with aryl substituents e.g., phenyl and benzyl. A preferred composition is poly(2-methoxy, 5-(2-ethyl-hexyloxy)-1,4 phenylene vinylene (MEH-PPV). Optionally, organic salts can be dispersed in the composition. Suitable organic salts are tetra alkyl, aryl or hertero aryl quaternary ammonium salts including tetra $C_{1-6}$ alkyl ammonium toluenesulfonate, tetra $C_{1-6}$ alkyl ammonium tetrafluoroborate, and tetra $C_{1-6}$ alkyl ammonium tetraphenylborate. Other suitable compositions and organic salts will be known to those skilled in the art.

In one embodiment, the light emitting composition can comprise a multi-layered organic structure (e.g., from 3 to 9 layers) with the organic hole injecting and/or transporting materials contiguous to the anode and the organic electron injecting and/or transporting materials adjacent to the cathode.

The anode electrode 6 suitably comprises transparent indium tin oxide or doped tin oxide or aluminum doped zinc oxide. The anode electrode is suitably supported on a transparent substrate 8 such as glass quartz or a polymer substrate such as polyethylene terephthalate or polyvinyl acetate.

The cathode electrode 4 comprises a metal with a low work function (e.g., less than 4.0 ev, preferably less than 3.5 ev) selected from alkali metals, alkaline earth metal or rare earth metal or alloys thereof. Preferred metals are calcium or alloys such as magnesium/silver; lithium/aluminum; or magnesium/aluminum. These metals provide low work function and thus enhanced quantum efficiency for the device.

The three layer protective covering 10 is preferably contiguous to cathode electrode 4. The first layer 12 of the protective covering contiguous to the electrode comprises a relatively stable metal, preferably aluminum or a transition metal, to passivate the reactive metal cathode. The metal will preferably be deposited onto the electrode using thin film deposition techniques without breaking vacuum through the same mask utilized to deposit the electrode onto the layer of the organic composition. Suitable metals include gold, silver, aluminum and indium. Thin film, deposition technique are well known to those skilled in the art such as ion beam deposition, electron beam deposition chemical vapor deposition, thermal evaporation, plasma beam deposition and sputter deposition. The metal layer is preferably deposited by thermal evaporation.

The second layer 14 comprises a dielectric material preferably deposited by thin film deposition techniques. Suitable inorganic dielectric materials include silicon oxide (e.g., silicon monoxide or silicon dioxide), silicon nitride, germanium oxide and insulating transition metal oxide (e.g., zirconium oxide). Preferably, the second layer is silicon nitride. The second layer is also suitably deposited by thermal or chemical vapor deposition (e.g., plasma enhanced CVD). The second layer is preferably deposited to a thickness less than 500 nm preferably about 50 nm to 200 nm to avoid cracking associated with thicker beam deposited layers of inorganic dielectric materials.

The third layer 16 of the protective covering comprises a hydrophobic polymer. Suitable hydrophobic materials include poly siloxanes, polytetrafluoethylene (teflon) and branched polyolefins e.g., polyethylene and polypropylene. The polymers are preferably adherent so that they will adhere to the second layer.

Optionally, a layer of glass or metal can be formed over the polymer layer for impact resistance.

The layers of the protective covering surprisingly cooperate to effectively protect the organic electroluminescent material and the reactive cathode electrode during normal use in an ambient environment from oxidative or hydrolytic degradation thereby improving the lifetime of the device.

Figure 2:
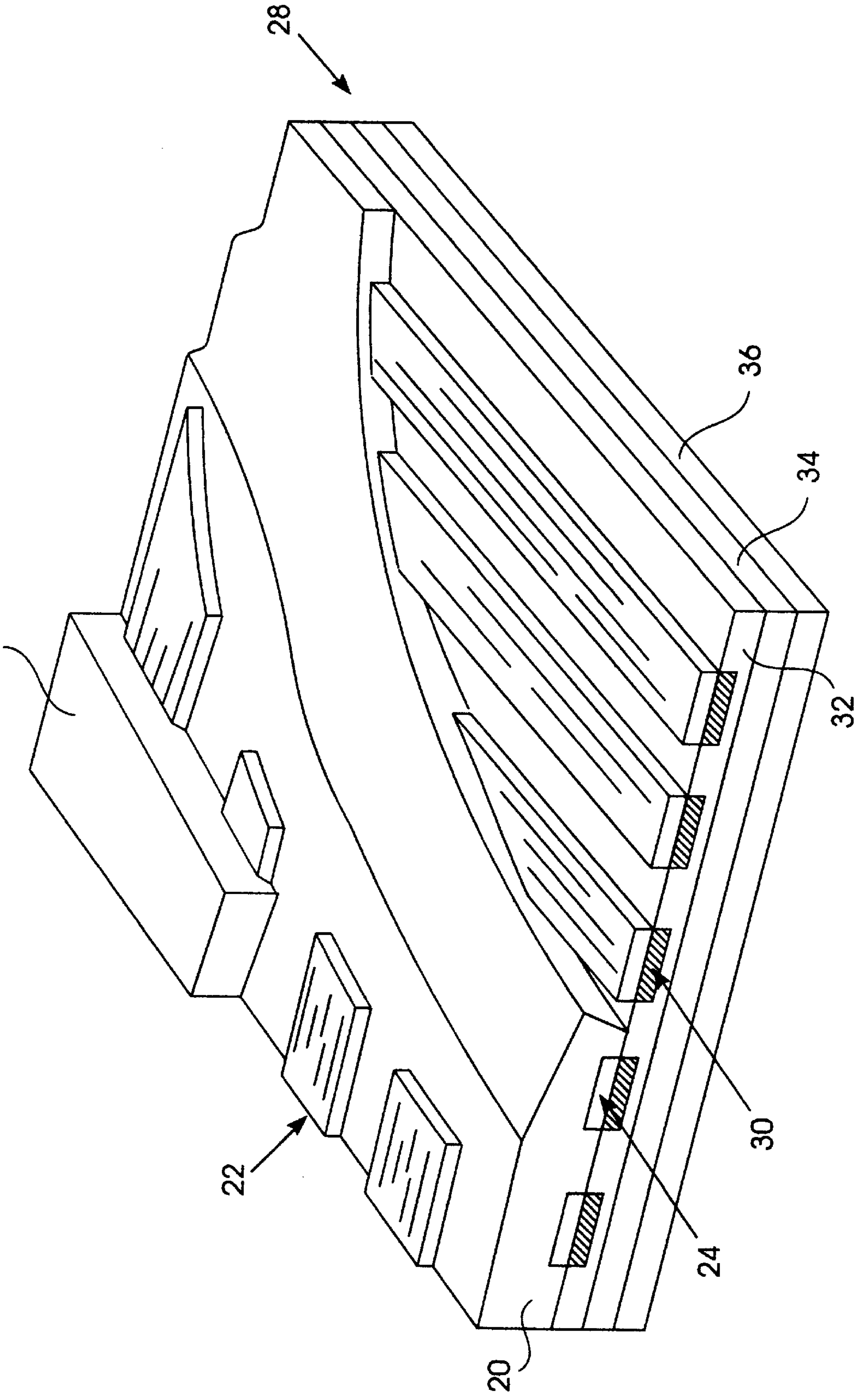
FIG. 2 is a sectional view of another embodiment of the light emitting device of the present invention.

Referring to FIG. 2, there is shown an alternative embodiment of the device of the present invention. The light emitting composition 20 is interposed between anode electrode 22 and cathode electrode 24. Anode electrode 22 is contiguous to glass substrate 26. Cathode electrode 24 is contiguous to protective covering 28. Protective covering 28 comprises metal layer 30, dielectric layer 32, polymer layer 34 and impact resistant layer 36.

The following examples are a detailed description of certain device of the present invention. The detailed description falls within the scope of, and serves to exemplify, the more generally described devices set forth above. The examples are presented for illustrative purposes only, and are not intended as a restriction on the scope of the invention.

EXAMPLE 1

An array of 12 light emitting devices was fabricated by the following sequence. An ITO stripe was sputter-deposited on a 7059 glass substrate. A thin (approx. 50 nm) polyaniline layer was spin-coated from aqueous solution and dried in a vacuum oven at 100° C. Under an atmosphere of dry nitrogen, the emissive polymer MEH-PPV was spin-coated at 1000 rpm from p-xylene solution to produce a film approximately 100 nm thick. Without exposure to air, the structure was loaded into an evaporator for the deposition of twelve separate calcium cathodes 25 nm in thickness. Using the same shadow mask, a layer of aluminum was deposited on top of the Ca. At 7 volts, with initial 2000 $Cd/m^2$, the device ran for over 100 hours in dry nitrogen glove box with less than a factor of ten reduction in intensity.

EXAMPLE 2

Two glass substrates with a patterned indium-tin oxide electrode were loaded into a high-vacuum ($4\times10^{-6}$ Torr) chamber. First, a layer of copper phthalocyanine was deposited through a shadow mask ("organic mask") at a rate of 0.3 nm/sec to a thickness of 10 nm. Next layer of the hole transporting material. N',N' dinaphthyl diphenyl benzidene was deposited through the organic mask at 1 nm/sec to 60 nm. Third, a layer of luminescent electron-transport material aluminum triquinolate was deposited at 0.6 nm/sec to 60 nm. Fourth, a Ag:Mg 1:10 contact was deposited through a different shadow mask (the "metal mask") to a thickness of 120 nm. This layer was then capped with a silver layer 55 nm thick. One of the substrates was then coated with an 80 nm film of silicon monoxide. Application of 100 mA current to the device in ambient air without SiO resulted in failure in less than 1 minute (e.g., device stops emitting light). The SiO coated device was run in ambient air at 100 mA (15 v) for a few hours before failure.

EXAMPLE 3

A device was constructed according to Example 1 and a layer of SiO was deposited by thermal evaporation through a shadow mask onto the aluminum. Then a glass cover, 0.5 mm in thickness was applied, using a ring of hot-melt glue (polyethylene-polypropylene blend) to bond and seal. The encapsulated structure was then removed from the glovebox and run at 7V for 120 hours with less than a factor of 10 reduction in intensity.

Although this invention has been described with respect to specific embodiments, the details thereof are not to be construed as limitations for it will be apparent that various embodiments, changes and modifications may be resorted to without departing from the spirit and scope thereof, and it is understood that such equivalent embodiments are intended to be included within the scope of this invention.

We claim:

1. A light emitting device comprising an organic light emitting material sandwiched between first and second electrode, the first electrode contiguous to a transparent substrate and the second electrode contiguous to a protective covering, the second electrode comprising an alkali metal, alkaline earth metal or rare earth metal and the protective covering comprising (a) a first layer of gold, silver, indium, aluminum or a transition metal directly on and in contact with the second electrode, (b) a second layer of dielectric material directly on and in contact with the first layer and selected from the group consisting of silicon nitride, silicon oxide, germanium oxide and zirconium oxide, the second layer having a thickness in the range of 50–500 nanometers, and (c) a third layer of hydrophobic polymer directly on and in contact with the second layer.

2. The device of claim 1 wherein the second electrode comprises an alkali metal or alkaline earth metal.

3. The device of claim 2 wherein the second electrode comprises calcium, lithium or magnesium.

4. The device of claim 3 wherein the first and second layer of the protective covering are deposited by thin film deposition.

5. The device of claim 1 wherein the polymer is polysiloxane, polytetrafluoroethylene or polyolefin.

6. The device of claim 1 wherein the protective covering further comprises an impact resistant fourth layer of glass or metal.

* * * * *